US012666809B2

(12) United States Patent
Yoo et al.

(10) Patent No.: US 12,666,809 B2
(45) Date of Patent: Jun. 23, 2026

(54) STRETCHABLE ORGANIC LIGHT EMITTING DIODE AND MANUFACTURING METHOD THEREOF

(71) Applicant: Korea Advanced Institute of Science and Technology, Daejeon (KR)

(72) Inventors: Seunghyup Yoo, Daejeon (KR); Donggyun Lee, Daejeon (KR); Hanul Moon, Daejeon (KR); Taehyun Kim, Daejeon (KR); Subon Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 471 days.

(21) Appl. No.: 18/383,252

(22) Filed: Oct. 24, 2023

(65) Prior Publication Data

US 2024/0298476 A1 Sep. 5, 2024

(30) Foreign Application Priority Data

Mar. 2, 2023 (KR) ........................ 10-2023-0027926

(51) Int. Cl.
| | |
|---|---|
| *H10K 59/122* | (2023.01) |
| *H10K 59/12* | (2023.01) |
| *H10K 59/173* | (2023.01) |
| *H10K 102/00* | (2023.01) |

(52) U.S. Cl.
CPC ....... *H10K 59/122* (2023.02); *H10K 59/1201* (2023.02); *H10K 59/173* (2023.02); *H10K 2102/311* (2023.02)

(58) Field of Classification Search
CPC ............. H10K 59/122; H10K 59/1201; H10K 59/173; H10K 2102/311; H10K 59/121; H10K 71/00; H10K 77/111; H10K 50/11; H10K 50/805; H10K 71/10
See application file for complete search history.

(56) References Cited

U.S. PATENT DOCUMENTS

| | | | | |
|---|---|---|---|---|
| 6,091,195 A * | 7/2000 | Forrest | ................. | H10K 59/878 |
| | | | | 313/506 |
| 8,207,473 B2 * | 6/2012 | Axisa | .................... | B32B 37/185 |
| | | | | 219/121.72 |
| 12,389,742 B2 * | 8/2025 | Helander | ............... | H10H 20/84 |
| 2014/0144480 A1 * | 5/2014 | Lee | ......................... | H10F 19/80 |
| | | | | 428/156 |
| 2016/0198567 A1 * | 7/2016 | Hong | .................... | G06F 3/0412 |
| | | | | 362/418 |

(Continued)

FOREIGN PATENT DOCUMENTS

| | | |
|---|---|---|
| JP | 2006-524834 A | 11/2006 |
| JP | 2020-533639 A | 11/2020 |

(Continued)

*Primary Examiner* — Victor A Mandala

(74) *Attorney, Agent, or Firm* — ArentFox Schiff LLP; Joseph M. Maraia

(57) ABSTRACT

Disclosed are a stretchable organic light emitting diode (OLED) and a manufacturing method thereof. The stretchable OLED may include a plurality of isolated regions configured to form an arrangement while protruding in a vertical direction; and a hidden light emitting region configured to interconnect the isolated regions and to expand and contract in the vertical direction.

20 Claims, 22 Drawing Sheets

100

(56) References Cited

U.S. PATENT DOCUMENTS

| 2019/0165055 A1* | 5/2019 | Choi | G09G 3/3233 |
| 2020/0161392 A1* | 5/2020 | Wang | H10K 59/124 |
| 2021/0027674 A1* | 1/2021 | Niu | H10K 77/111 |
| 2023/0109049 A1* | 4/2023 | Wang | B32B 3/30 |
| | | | 361/807 |

FOREIGN PATENT DOCUMENTS

| KR | 10-2016-0084964 A | 7/2016 |
| KR | 1020220026957 A | 3/2022 |

* cited by examiner

100

<u>100</u>

100

$$FF = \left( \frac{L_0}{L_0 + L_{int}} \right)^2 + \frac{2 L_0 L_{int}}{\left( L_0 + L_{int} \right)^2}$$

\* FF : Area ratio,    $\varepsilon_{sys}$ : Strain rate $$FF = \left( \frac{L_0}{L_0 + L_{int}} \right)^2$$

* FF : Area ratio,   $\varepsilon_{sys}$ : Strain rate

FIG. 4A

| Polyimide (1 μm) |
| Eagle XG glass wafer |

FIG. 4B

| Aluminum (200 nm) |
| Polyimide (1 $\mu$m) |
| Eagle XG glass wafer |

FIG. 4C

| PR coating (GXR-601) |
| Aluminum (200 nm) |
| Polyimide (1 μm) |
| Eagle XG glass wafer |

PR coating (GXR-601)

Aluminum (200 nm)

Polyimide (1 μm)

Eagle XG glass wafer

Eagle XG glass wafer

Organic light emitting diode (OLED)

Laser lift-off

Eagle XG glass wafer

FIG. 5A

PDMS 6:1

Aluminum mold

Glass

Spacer

Ecoflex 0020

STRETCHABLE ORGANIC LIGHT EMITTING DIODE AND MANUFACTURING METHOD THEREOF

CROSS-REFERENCE TO RELATED APPLICATION(S)

This application claims the priority benefit of Korean Patent Application No. 10-2023-0027926, filed on Mar. 2, 2023, in the Korean Intellectual Property Office, the disclosure of which is incorporated herein by reference.

BACKGROUND

1. Field of the Invention

The following example embodiments relate to technology for a stretchable organic light emitting diode (OLED).

2. Description of the Related Art

The current display industry focuses on manufacturing a display with an improved form factor, such as flexible and foldable.

A stretchable organic light emitting diode (OLED) refers to a display platform with an ultimate form factor. The existing stretchable OLED has a structure that includes isolated regions and an interconnector configured to interconnect the isolated regions and to contract and extend in a horizontal direction.

However, since the existing stretchable OLED has a structure in which an interconnector portion stretches in the horizontal direction when extending from a contracted state, an empty space may be generated, which may lead to reducing an area ratio.

Therefore, there is a need to propose technology for overcoming the limitation that an area ratio decreases during contraction.

SUMMARY

To implement a much more improved light emitting area ratio than that of a diode in an existing structure and to achieve mechanical stability against an external impact, example embodiments provide a stretchable organic light emitting diode (OLED) in a structure that includes a hidden light emitting region configured to expand and contract in a vertical direction.

Also, to minimize a strain rate of isolated regions, example embodiments provide a stretchable OLED that implements a structure in which isolated regions of an OLED layer are aligned and joined on fixed regions that maintain a fixed shape while using a stretchable base layer and the fixed regions formed thereon as a stretchable wafer.

Also, to overcome the limitation that a diode in an existing structure of extending in 2 axes has a bent edge and to implement an edge in a uniform shape close to a straight line without a bent shape, example embodiments provide a stretchable OLED that may extend in directions of four axes or more on a horizontal plane.

However, the technical objectives to be solved by the present invention are not limited to the aforementioned objectives and may be variously expanded without departing from the technical spirit and scope of the present invention.

According to an example embodiment, there is provided a stretchable OLED including a plurality of isolated regions configured to form an arrangement while protruding in a vertical direction; and a hidden light emitting region configured to interconnect the isolated regions and to expand and contract in the vertical direction.

According to an aspect, the hidden light emitting region may be configured to be buckled to be hidden within a space between the isolated regions without being exposed to the surface of the isolated regions when the stretchable OLED contracts in a horizontal direction.

According to another aspect, the stretchable OLED may be configured to compensate for a light emitting area as the hidden light emitting region is exposed between the isolated regions when extending in the horizontal direction.

According to still another aspect, the stretchable OLED may be configured to be extendable in the horizontal direction by applying a tensile force of four axes or more on a horizontal plane.

According to still another aspect, the stretchable OLED may further include a stretchable base layer formed with a plurality of fixed regions that forms the arrangement while protruding in the vertical direction. The isolated regions may be aligned and joined on the fixed regions.

According to still another aspect, the fixed regions may be formed of a material different from that of the base layer to maintain a fixed shape without extending in a horizontal direction when a tensile force is applied to the base layer in the horizontal direction.

According to still another aspect, the stretchable OLED may be configured to exposes the hidden light emitting region between the isolated regions in response to a horizontal extension of a region in which the fixed regions are not formed in the base layer when extending in the horizontal direction.

According to still another aspect, the stretchable OLED may be configured to be extendable in the horizontal direction as the region in which the fixed regions are not formed in the base layer extends in the horizontal direction by applying the tensile force of four axes or more on a horizontal plane in the region in which the fixed regions are not formed in the base layer.

According to still another aspect, the hidden light emitting region may have a structure in which a corresponding region between diagonally adjacent isolated regions among the isolated regions is empty.

According to still another aspect, the stretchable OLED may further include at least one electrode configured to electrically connect to the isolated regions and the hidden light emitting region.

According to still another aspect, the isolated regions and the hidden light emitting region may be collectively formed using the same material.

According to an example embodiment, there is provided a stretchable OLED including a plurality of isolated regions configured to form an arrangement while protruding in a vertical direction; and a hidden light emitting region configured to interconnect the isolated regions, to be bucked within a space between the isolated regions without being exposed to the surface of the isolated regions when the stretchable OLED contracts in a horizontal direction, and to be exposed between the isolated regions when the stretchable OLED extends in the horizontal direction.

According to an example embodiment, there is provided a manufacturing method of an OLED, the method including forming an OLED layer using a stretchable material, the OLED layer including a plurality of isolated regions configured to form an arrangement while protruding in a vertical direction and a hidden light emitting region configured to interconnect the isolated regions; preparing a stretchable base layer formed with a plurality of fixed regions config- ured to form the arrangement while protruding in the vertical direction; joining the isolated regions on the fixed regions in a state in which the base layer extends in a horizontal direction by applying a tensile force to the base layer; and buckling the hidden light emitting region in the vertical direction by removing the tensile force applied to the base layer to shrink the base layer.

According to an aspect, the buckling of the hidden light emitting region in the vertical direction may include buck- ling the hidden light emitting region in the vertical direction such that the hidden light emitting region is hidden within the space between the isolated regions without being exposed to the surface of the isolated regions when the base layer contracts in the horizontal direction.

According to another aspect, the fixed regions may be formed of a material different from that of the base layer to maintain a fixed shape without extending in the horizontal direction when the tensile force is applied to the base layer.

According to still another aspect, the preparing of the base layer may include forming the fixed regions using a material robust against the tensile force; and forming the base layer joined to the fixed regions using the stretchable material.

According to still another aspect, the joining of the isolated regions may include aligning and joining the iso- lated regions on the fixed regions in a state in which a region in which the fixed regions are not formed in the base layer extends in the horizontal direction.

According to still another aspect, the aligning and the joining of the isolated regions on the fixed regions may include extending the region in which the fixed regions are not formed in the base layer in the horizontal direction by applying the tensile force of four axes or more on the horizontal plane in the region in which the fixed regions are not formed in the base layer.

According to still another aspect, the forming of the OLED layer may include collectively forming the isolated regions and the hidden light emitting region using the same material.

According to still another aspect, the forming of the OLED layer may include forming a corresponding region between diagonally adjacent isolated regions among the isolated regions on the hidden light emitting region in an empty structure.

According to some example embodiments, it is possible to implement a much more improved light emitting area ratio than that of a diode in an existing structure and to achieve mechanical stability against an external impact by providing a stretchable OLED in a structure that includes a hidden light emitting region configured to expand and contract in a vertical direction.

Also, according to some example embodiments, it is possible to minimize a strain rate of isolated regions by providing a stretchable OLED that implements a structure in which isolated regions of an OLED layer are aligned and joined on fixed regions that maintain a fixed shape while using a stretchable base layer and the fixed regions formed thereon as a stretchable wafer.

Also, according to some example embodiments, it is possible to overcome the limitation that a diode in an existing structure of extending in two axes has a bent edge and to implement an edge in a uniform shape close to a straight line without a bent shape by providing a stretchable OLED that may extend in directions of four axes or more on a horizontal plane.

However, the effects of the present invention are not limited to the aforementioned effects and may be variously expanded without departing from the technical spirit and scope of the present invention.

BRIEF DESCRIPTION OF THE DRAWINGS

These and/or other aspects, features, and advantages of the invention will become apparent and more readily appre- ciated from the following description of embodiments, taken in conjunction with the accompanying drawings of which:

FIGS. 4A to 4H illustrate a detailed process of operation S310 of FIG. 3;

FIGS. 5A to 5D illustrate a detailed process of operation S320 of FIG. 3; and

DETAILED DESCRIPTION

Figure 1A:
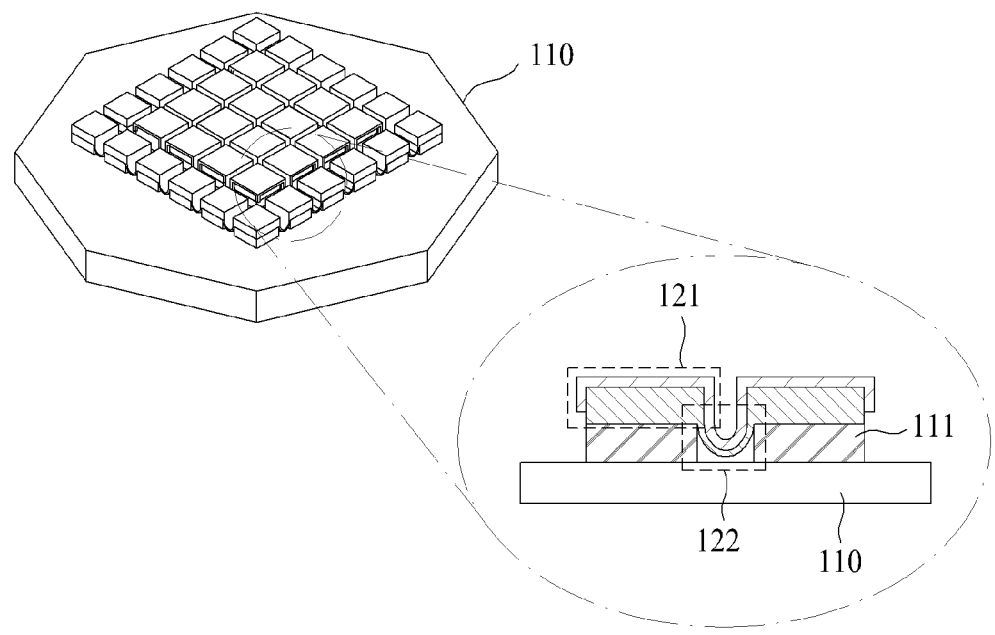
FIGS. 1A to 1C illustrate a stretchable organic light emitting diode (OLED) according to an example embodi- ment.

Hereinafter, example embodiments will be described with reference to the accompanying drawings. However, the present invention is not limited to or restricted by the example embodiments. Also, like reference numerals pro- posed in the respective drawings refer to like elements throughout.

Also, terms (terminology) used herein refer to terms used to appropriately express the example embodiments and may vary depending on the intention of a viewer or an operator, or customs of the field to which the present invention pertains. Therefore, the definition for the terms should be made based on the overall contents of the present specifi- cation. For example, the singular forms "a," "an," and "the" are intended to include the plural forms as well, unless the context clearly indicates otherwise. Also, it will be further understood that "comprises" and/or "comprising" when used herein, specify the presence of stated features, integers, steps, operations, elements, and/or components, but do not preclude the presence or addition of one or more other features, integers, steps, operations, elements, components and/or groups thereof.

Also, it should be understood that various example embodiments should not be mutually exclusive although they differ from each other. For example, specific shapes, structures, and features described herein may be imple- mented in another implementation example without depart- ing from the technical spirit and scope of the present invention. Also, it should be understood that locations, arrangements, or configurations of individual components in each proposed example embodiment scope may be changed without departing from the technical spirit and scope of the present invention.

The term "horizontal direction" described herein repre- sents a direction perpendicular to a direction of gravity and the term "vertical direction" represents a direction perpen- dicular to the "horizontal direction."

Figure 1B:
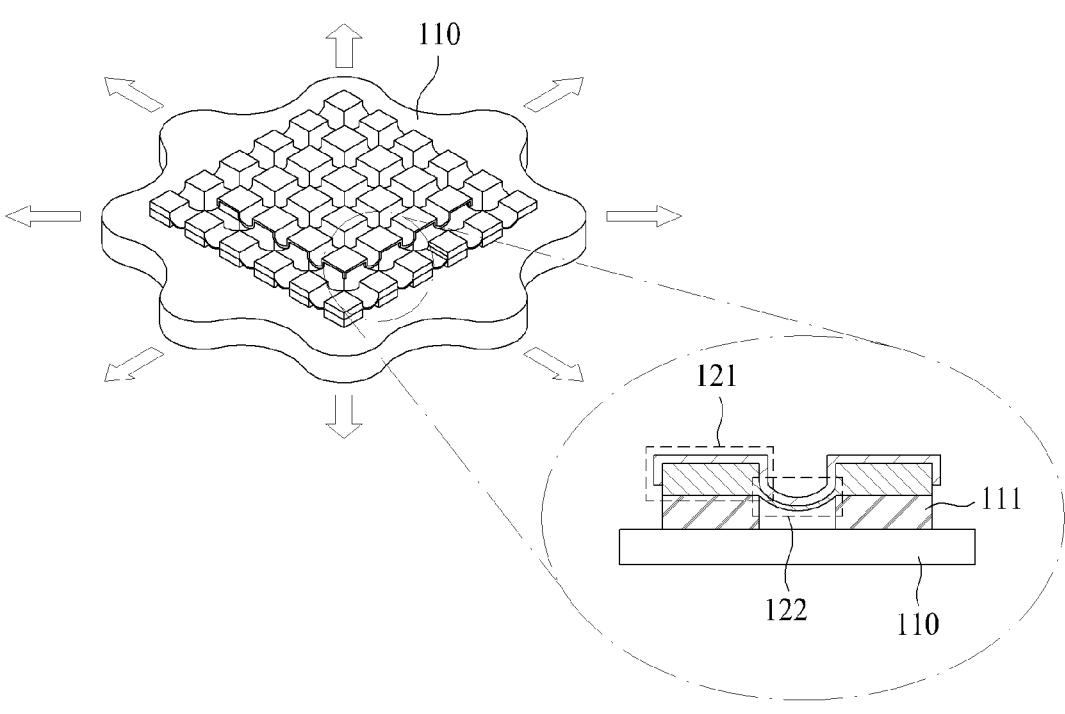
Figure 1C:
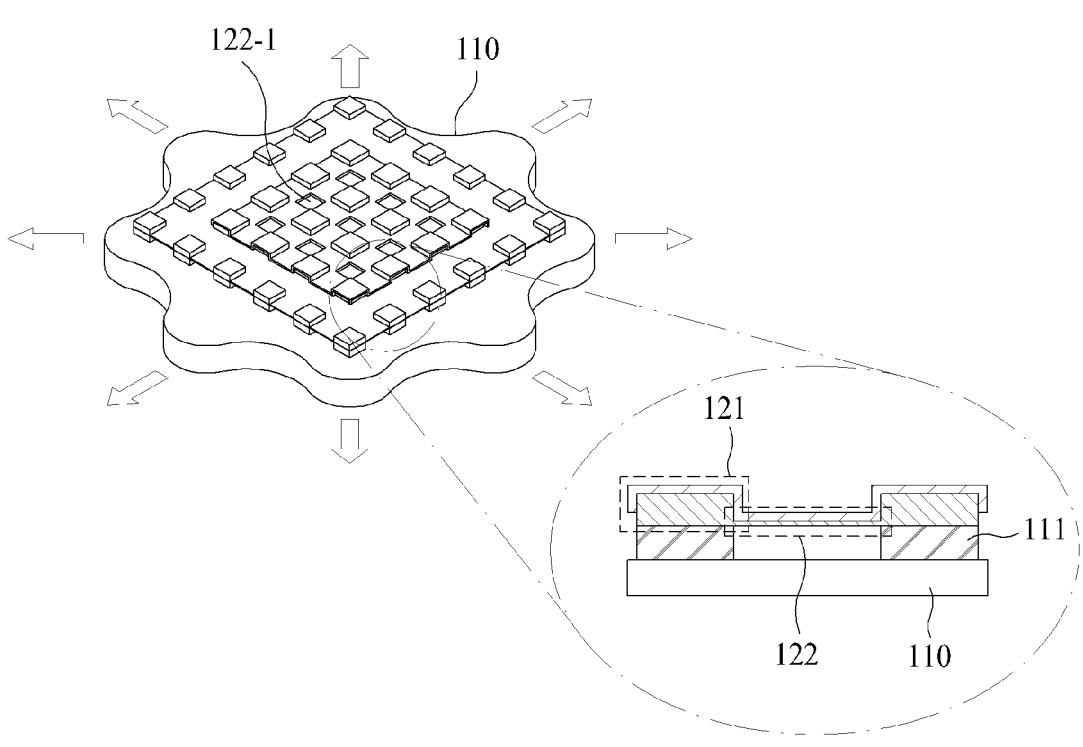
Figure 2A:
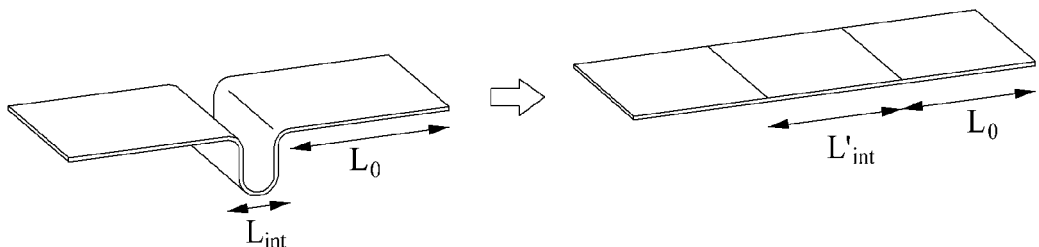
FIGS. 2A to 2C illustrate examples of describing excel- lence of a stretchable OLED according to an example embodiment.
Figure 2B:
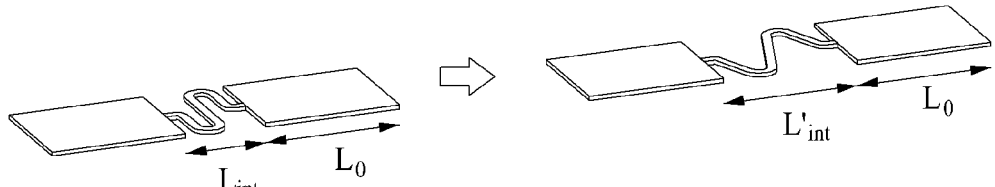
Figure 2C:
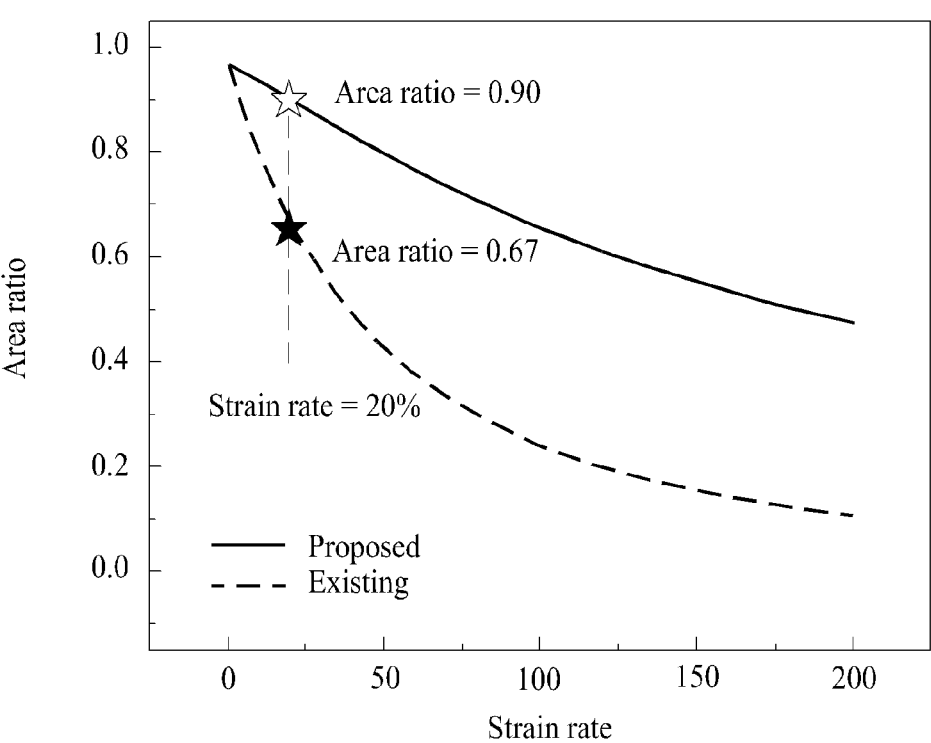

FIGS. 1A to 1C illustrate a stretchable organic light emitting diode (OLED) according to an example embodi- ment, and FIGS. 2A to 2C illustrate examples of describing excellence of a stretchable OLED according to an example embodiment. In detail, FIG. 1A illustrates a state in which the stretchable OLED is contracted, FIG. 1B illustrates a state in which the stretchable OLED is extended to a medium level, and FIG. 1C illustrates a state in which the stretchable OLED is fully extended.

A stretchable OLED 100 according to an example embodiment may include a base layer 110, an OLED layer 120, and at least one electrode (not shown).

The base layer 110 may be formed of a stretchable material (e.g., Ecoflex 0020), and a plurality of fixed regions 111 arranged while protruding in a vertical direction may be formed on the base layer 110.

Here, the fixed regions 111 may be formed of a material (e.g., PDMS) different from that of the base layer 110 to maintain a fixed shape without extending in a horizontal direction when a horizontal tensile force is applied to the base layer 110 in the horizontal direction. That is, the base layer 110 in which the fixed regions 111 are formed may constitute a heterogeneous elastic polymer.

Therefore, that the base layer 110 extends in the horizontal direction may represent that a region in which the fixed regions 111 are not formed in the base layer 110 extends in the horizontal direction. Since the region in which the fixed regions 111 are not formed in the base layer 110 extends in the horizontal direction, the stretchable OLED 100 may extend in the horizontal direction.

The OLED layer 120 may include a plurality of isolated regions 121 configured to form an arrangement while protruding in the vertical direction and a hidden light emitting region 122 configured to interconnect the isolated regions 121 and to expand and contract in the vertical direction. In the following, the hidden light emitting region 122 is also in charge of interconnecting the isolated regions 121 and may be referred to as an interconnector or a stretchable interconnector.

The isolated regions 121 and the hidden light emitting region 122 may be collectively formed using the same material, but the present invention is not limited thereto or restricted thereby.

The isolated regions 121 may be aligned and joined on the fixed regions 111. Therefore, although the stretchable OLED 100 extends in the horizontal direction, the isolated regions 121 may maintain a fixed shape without extension due to the fixed regions 111 that maintain the fixed shape.

Here, that the hidden light emitting region 122 expands and contracts in the vertical direction represents that, when the stretchable OLED 100 contracts in the horizontal direction, the hidden light emitting region 122 is buckled in the vertical direction to be hidden within a space between the isolated regions 121 without being exposed to the surface of the isolated regions 121 as shown in an enlarged portion of FIG. 1A and, when the stretchable OLED 100 extends in the horizontal direction, the hidden light emitting region 122 moves in the vertical direction and is exposed between the isolated regions 121 as shown in enlarged portions of FIGS. 1B and 1C.

As described above, since the hidden light emitting region 122 may expand and contract in the vertical direction as shown in FIG. 2A, the hidden emitting region 122 may have a significantly improved area ratio compared to that of an existing structure that expands and contracts in the horizontal direction as shown in FIG. 2B, which may be proved as shown in FIG. 2C. The improved area ratio compared to that of the existing structure may represent that, if manufactured in the same size as the existing structure, an increased light emitting area compared to that of the existing structure may be achieved (compensating for the light emitting area).

As described above, when the stretchable OLED 100 extends in the horizontal direction, only the region in which the fixed regions 111 are not formed in the base layer 110 extends in the horizontal direction. Therefore, in response to the horizontal extension of only the region in which the fixed regions 111 are not formed in the base layer 110, the hidden light emitting region 122 may be exposed between the isolated regions 121.

Here, the hidden light emitting region 122 may have a structure in which a corresponding region 122-1 between the diagonally adjacent isolated regions 121 among the isolated regions 121 is empty. This is to ensure that when the stretchable OLED 100 contracts in the horizontal direction, the hidden light emitting region 122 is all hidden within the space between the isolated regions 121 without being exposed to the surface of the isolated regions 121.

The aforementioned horizontal extension, that is, extension in the horizontal direction may be implemented by applying a tensile force of four axes or more on the horizontal plane. That is, the horizontal extension represents extension in directions of four axes or more on the horizontal plane.

Also, although not illustrated in a separate drawing, the stretchable OLED 100 may further include at least one electrode (not shown) configured to electrically connect to the isolated regions 121 and the hidden light emitting region 122.

The stretchable OLED 100 according to the example embodiment may implement a much more improved light emitting area ratio than that of a diode in an existing structure and may achieve mechanical stability of the hidden light emitting region 122 against an external impact by including the hidden light emitting region 122 configured to expand and contract in the vertical direction.

Also, the stretchable OLED 100 according to the example embodiment may minimize a strain rate of the isolated regions 121 by implementing a structure in which the isolated regions 121 of the OLED layer 120 are aligned and joined on the fixed regions 111 that maintain a fixed shape while using the stretchable base layer 110 and the fixed regions 111 formed thereon as a stretchable wafer.

Also, since the stretchable OLED 100 according to the example embodiment may extend in directions of four axes or more on the horizontal plane, it is possible to overcome the limitation that a diode in an existing structure of extending in two axes has a bent edge and to implement an edge in a uniform shape close to a straight line without a bent shape.

Hereinafter, a manufacturing method of the stretchable OLED 100 in the aforementioned structure will be described.

Figure 3:
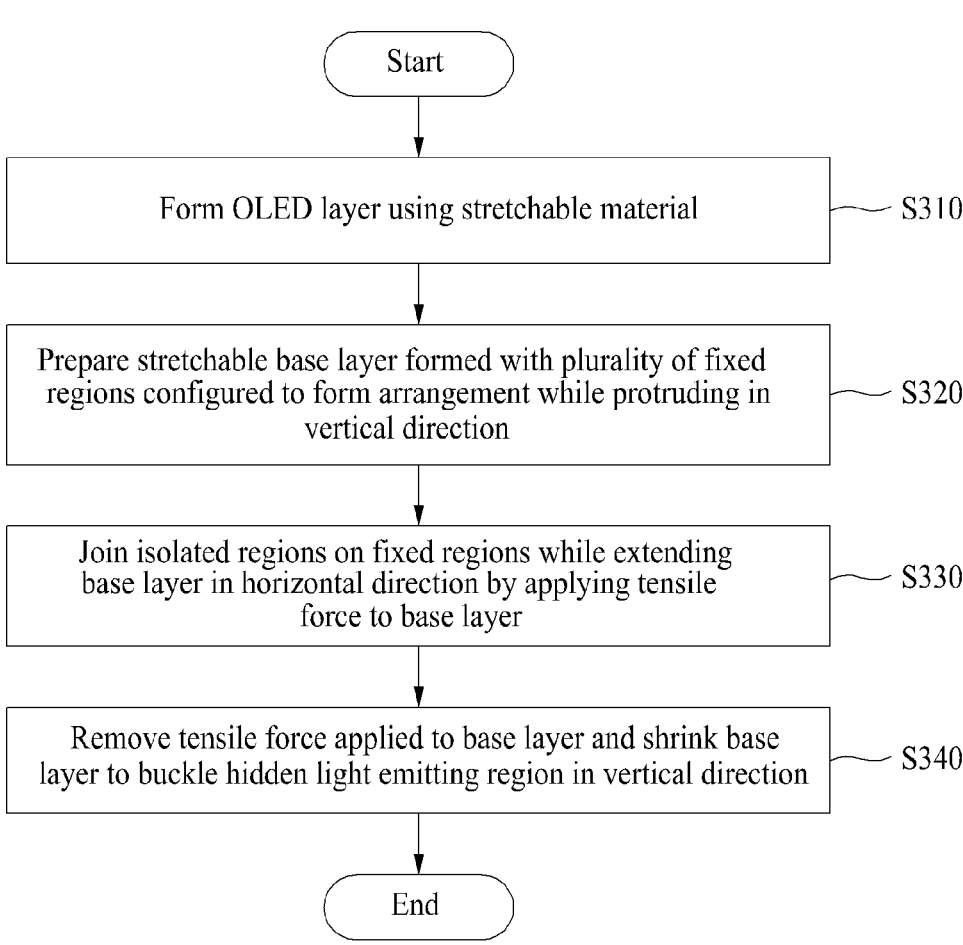
FIG. 3 is a flowchart illustrating a manufacturing method of a stretchable OLED according to an example embodi- ment.

FIG. 3 is a flowchart illustrating a manufacturing method of a stretchable OLED according to an example embodiment, FIGS. 4A to 4H illustrate a detailed process of operation S310 of FIG. 3, FIGS. 5A to 5D illustrate a detailed process of operation S320 of FIG. 3, and FIGS. 6A to 6C illustrate a detailed process of operations S330 and S340 of FIG. 3. In the following description, the manufacturing method of the stretchable OLED is assumed to be performed by an automated and mechanized manufacturing system and the stretchable OLED 100 in the aforementioned structure may be completely manufactured as a result of performing operations S310 to S340 described below.

In operation S310, a manufacturing system may form the OLED layer 120 using a stretchable material.

Here, the OLED layer 120 may include the plurality of isolated regions 121 configured to form an arrangement while protruding in the vertical direction and the hidden light emitting region 122 configured to interconnect the isolated regions 121.

The isolated regions 121 and the hidden light emitting region 122 may be collectively formed using the same material and the hidden light emitting region 122 may have the structure in which the corresponding region 122-1 between the diagonally adjacent isolated regions 121 among the isolated regions 121 is empty.

Figure 4A:
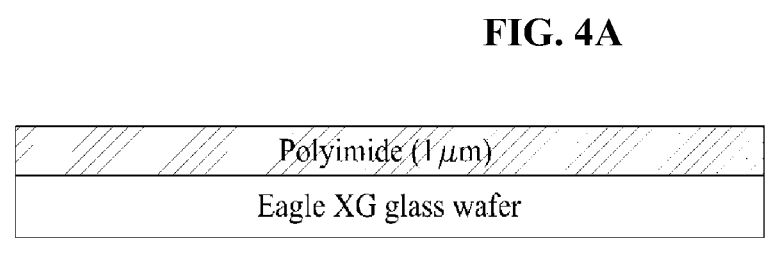
Figure 4C:
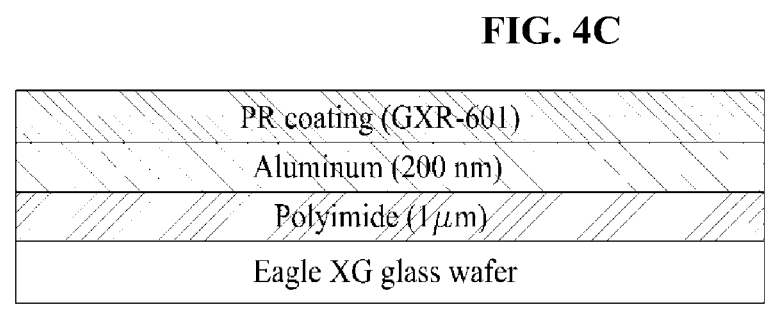
Figure 4D:
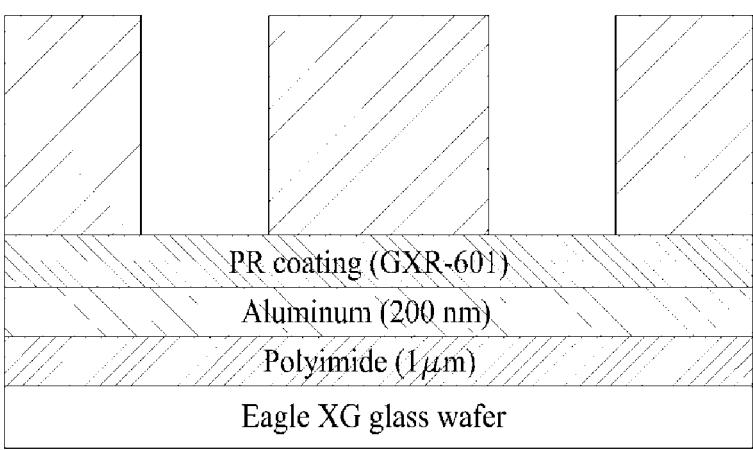
Figure 4E:
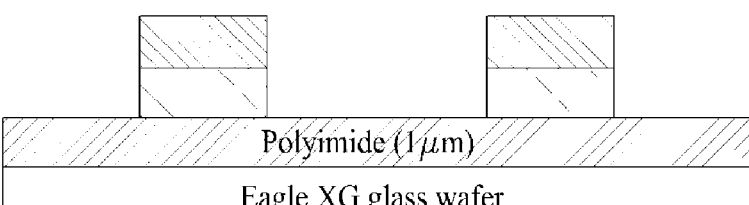
Figure 4F:
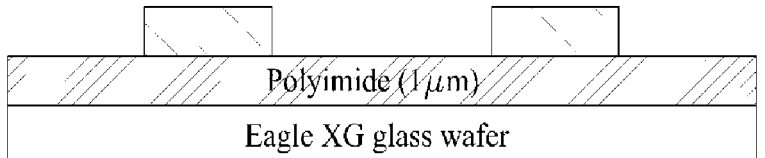
Figure 4G:
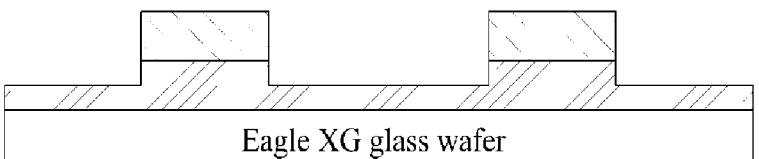
Figure 4H:
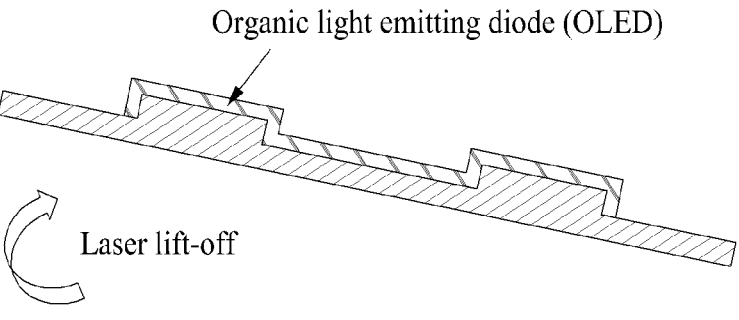

Operation S310 may be performed through processes as shown in FIGS. 4A to 4H. For example, the manufacturing system may form the OLED layer 120 through the process of coating polyimide on a wafer to 1um under the conditions of 8000 rpm, 30 s, and 3 acl as shown in FIG. 4A, the process of sputtering aluminum at 200 nm on polyimide as shown in FIG. 4B, the process of coating photoresist (PR) on aluminum as shown in FIG. 4C, the process of patterning photoresist using a mask as shown in FIG. 4D, the process of performing aluminum wet etching as shown in FIG. 4E, the process of performing photoresist stripping as shown in FIG. 4F, the process of forming a polyimide pattern by performing dry etching of a predetermined depth in a partial region of polyimide as shown in FIG. 4G, and the process of depositing an OLED on the polyimide pattern and performing laser lift-off as shown in FIG. 4H.

In operation S320, the manufacturing system may prepare the stretchable base layer 110 formed with the plurality of fixed regions 111 configured to form the arrangement while protruding in the vertical direction.

Here, the fixed regions 111 may be arranged at narrower intervals than the isolated regions 121 of the OLED layer 120. Therefore, when the region in which the fixed regions 111 are not formed in the base layer 110 extends in the horizontal direction, the fixed regions 111 may be arranged at the same intervals as the isolated regions 121. This is to ensure that the fixed regions 111 are aligned with the isolated regions 121 in response to the horizontal extension of the region in which the fixed regions 111 are not formed in the base layer 110 in operation S330.

The fixed regions 111 may be formed of a material different from that of the base layer 110 to maintain a fixed shape without extending in the horizontal direction when a horizontal tensile force is applied to the base layer 110.

Therefore, operation S320 may include a first stage of forming the fixed regions 111 using a material resistant to a tensile force and a second stage of forming the base layer 110 joined to the fixed regions 111 using a stretchable material.

Operation S320 may be performed through processes as shown in FIGS. 5A to 5D.

Figure 5A:
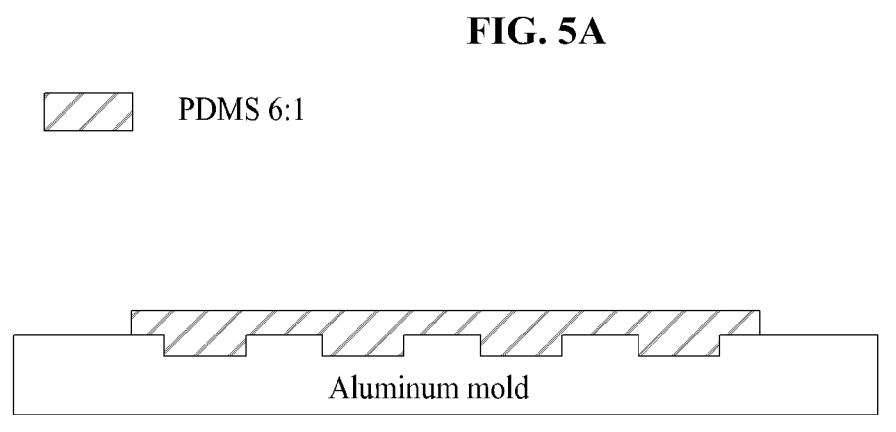
Figure 5B:
Figure 5C:
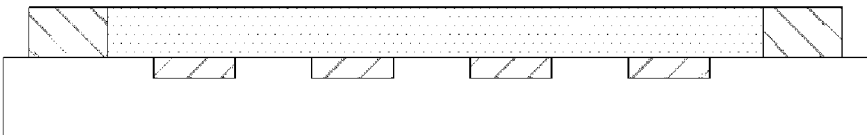
Figure 5D:
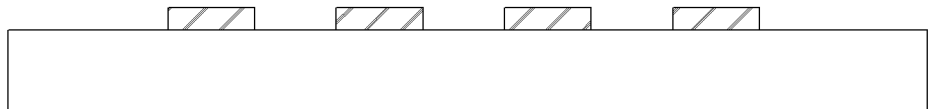

For example, the manufacturing system may prepare the base layer 110 formed with the fixed regions 111 through the process of forming the fixed regions 111 by forming PDMS on an aluminum mold with a pattern formed on the surface as shown in FIG. 5A and by performing doctor blading using glass on the surface of the aluminum mold in which the PDMS is formed as shown in FIG. 5B, the process of forming the base layer 110 with Ecoflex 0020 in the fixed regions 111 as shown in FIG. 5C, and the process of separating, from the aluminum mold using a spacer, the base layer 110 formed with the fixed regions 111 as shown in FIG. 5D.

In operation S330, the manufacturing system may join the isolated regions 121 on the fixed regions 111 while extending the base layer 110 in the horizontal direction by applying a tensile force to the base layer 110.

In detail, in operation S330, the manufacturing system may align and join the isolated regions 121 on the fixed regions 110 while horizontally extending the region in which the fixed regions 111 are not formed in the base layer 110.

Here, horizontally extending the region in which the fixed regions 111 are not formed in the base layer 110 may be implemented by applying the tensile force of four axes or more on the horizontal plane in the region in which the fixed regions 111 are not formed in the base layer 110.

In operation S340, the manufacturing system may remove the tensile force applied to the base layer 110 and shrink the base layer 110 to buckle the hidden light emitting region 122 in the vertical direction.

In detail, in operation S340, the manufacturing system may buckle the hidden light emitting region 122 in the vertical direction such that the hidden light emitting region 122 may be hidden within the space between the isolated regions 121 without being exposed to the surface of the isolated regions 121 when the base layer 110 contracts in the horizontal direction.

Therefore, the manufactured stretchable OLED 100 may allow the hidden light emitting region 122 to be hidden in the space between the isolated regions 121 without being exposed to the surface of the isolated regions 121 when contracting in the horizontal direction, and may allow the hidden light emitting region 122 to move in the vertical direction and to be exposed between the isolated regions 121 when extending in the horizontal direction.

Figure 6A:
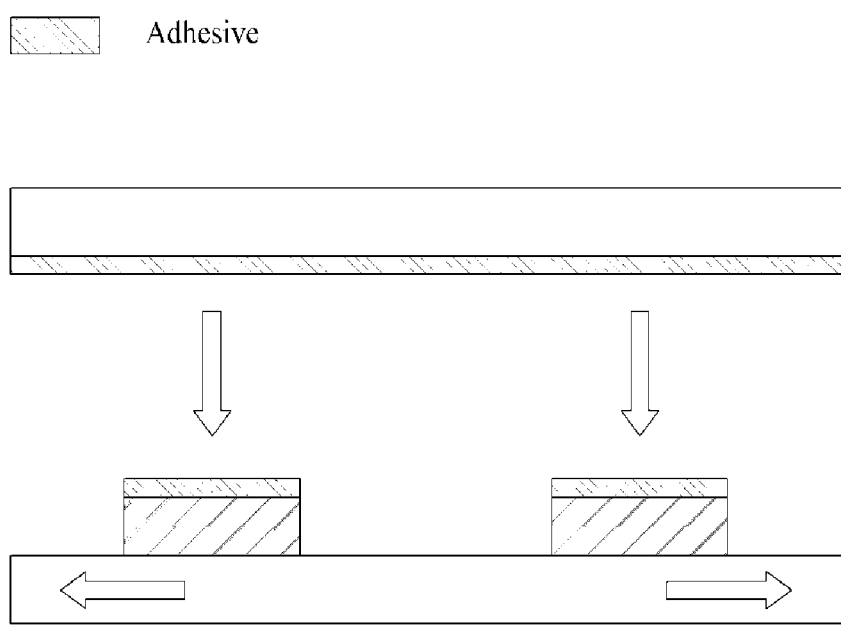
FIGS. 6A to 6C illustrate a detailed process of operations S330 and S340 of FIG. 3.
Figure 6B:
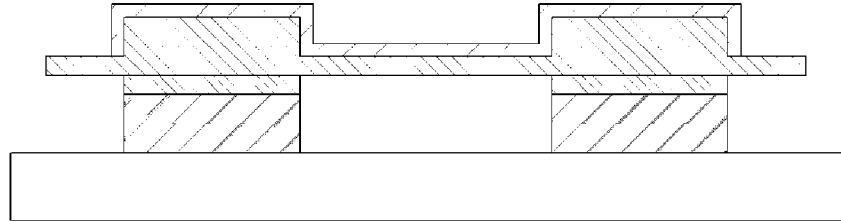
Figure 6C:
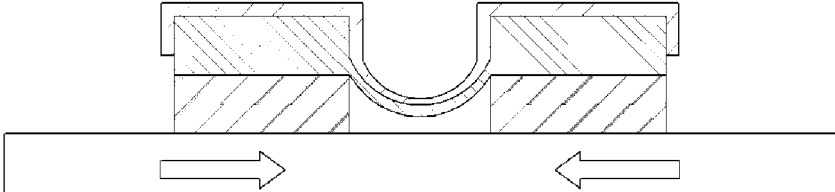

Operations S330 and S340 may be performed through processes as shown in FIGS. 6A to 6C.

For example, the manufacturing system may join the isolated regions 121 on the fixed regions 111 and may buckle the hidden light emitting region 122 in the vertical direction through the process of applying the tensile force of four axes or more on the horizontal plane in the base layer 110 and then applying adhesive to the fixed regions 111 as shown in FIG. 6A, the process of selectively joining the isolated regions 121 on the fixed regions 111 through the adhesive as shown in FIG. 6B, and the process of removing the tensile force applied to the base layer 110, thereby shrinking the base layer 110 and buckling the hidden light emitting region 122 in the vertical direction as shown in FIG. 6C.

While the example embodiments are described with reference to specific example embodiments and drawings, it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A stretchable organic light emitting diode (OLED) comprising:

a plurality of isolated regions configured to form an arrangement while protruding in a vertical direction; and a hidden light emitting region configured to interconnect the isolated regions and to expand and contract in the vertical direction.

2. The stretchable OLED of claim 1, wherein the hidden light emitting region is configured to be buckled to be hidden within a space between the isolated regions without being exposed to the surface of the isolated regions when the stretchable OLED contracts in a horizontal direction.

3. The stretchable OLED of claim 2, wherein the stretchable OLED is configured to compensate for a light emitting area as the hidden light emitting region is exposed between the isolated regions when extending in the horizontal direction.

4. The stretchable OLED of claim 3, wherein the stretchable OLED is configured to be extendable in the horizontal direction by applying a tensile force of four axes or more on a horizontal plane.

5. The stretchable OLED of claim 1, further comprising:
a stretchable base layer formed with a plurality of fixed regions that forms the arrangement while protruding in the vertical direction,
wherein the isolated regions are aligned and joined on the fixed regions.

6. The stretchable OLED of claim 5, wherein the fixed regions are formed of a material different from that of the base layer to maintain a fixed shape without extending in a horizontal direction when a tensile force is applied to the base layer in the horizontal direction.

7. The stretchable OLED of claim 6, wherein the stretchable OLED is configured to expose the hidden light emitting region between the isolated regions in response to a horizontal extension of a region in which the fixed regions are not formed in the base layer when extending in the horizontal direction.

8. The stretchable OLED of claim 7, wherein the stretchable OLED is configured to be extendable in the horizontal direction as the region in which the fixed regions are not formed in the base layer extends in the horizontal direction by applying the tensile force of four axes or more on a horizontal plane in the region in which the fixed regions are not formed in the base layer.

9. The stretchable OLED of claim 1, wherein the hidden light emitting region has a structure in which a corresponding region between diagonally adjacent isolated regions among the isolated regions is empty.

10. The stretchable OLED of claim 1, further comprising:
at least one electrode configured to electrically connect to the isolated regions and the hidden light emitting region.

11. The stretchable OLED of claim 1, wherein the isolated regions and the hidden light emitting region are collectively formed using the same material.

12. A stretchable organic light emitting diode (OLED) comprising:
a plurality of isolated regions configured to form an arrangement while protruding in a vertical direction; and
a hidden light emitting region configured to interconnect the isolated regions, to be bucked within a space between the isolated regions without being exposed to the surface of the isolated regions when the stretchable OLED contracts in a horizontal direction, and to be exposed between the isolated regions when the stretchable OLED extends in the horizontal direction.

13. A manufacturing method of a stretchable organic light emitting diode (OLED), the method comprising:
forming an OLED layer using a stretchable material, the OLED layer including a plurality of isolated regions configured to form an arrangement while protruding in a vertical direction and a hidden light emitting region configured to interconnect the isolated regions;
preparing a stretchable base layer formed with a plurality of fixed regions configured to form the arrangement while protruding in the vertical direction;
joining the isolated regions on the fixed regions in a state in which the base layer extends in a horizontal direction by applying a tensile force to the base layer; and
buckling the hidden light emitting region in the vertical direction by removing the tensile force applied to the base layer to shrink the base layer.

14. The method of claim 13, wherein the buckling of the hidden light emitting region in the vertical direction comprises buckling the hidden light emitting region in the vertical direction such that the hidden light emitting region is hidden within the space between the isolated regions without being exposed to the surface of the isolated regions when the base layer contracts in the horizontal direction.

15. The method of claim 13, wherein the fixed regions are formed of a material different from that of the base layer to maintain a fixed shape without extending in the horizontal direction when the tensile force is applied to the base layer.

16. The method of claim 15, wherein the preparing of the base layer comprises:
forming the fixed regions using a material robust against the tensile force; and
forming the base layer joined to the fixed regions using the stretchable material.

17. The method of claim 15, wherein the joining of the isolated regions comprises aligning and joining the isolated regions on the fixed regions in a state in which a region in which the fixed regions are not formed in the base layer extends in the horizontal direction.

18. The method of claim 17, wherein the aligning and the joining of the isolated regions on the fixed regions comprises extending the region in which the fixed regions are not formed in the base layer in the horizontal direction by applying the tensile force of four axes or more on the horizontal plane in the region in which the fixed regions are not formed in the base layer.

19. The method of claim 13, wherein the forming of the OLED layer comprises collectively forming the isolated regions and the hidden light emitting region using the same material.

20. The method of claim 13, wherein the forming of the OLED layer comprises forming a corresponding region between diagonally adjacent isolated regions among the isolated regions on the hidden light emitting region in an empty structure.

* * * * *